United States Patent [19]

Egozi

[11] Patent Number: 5,465,287
[45] Date of Patent: Nov. 7, 1995

[54] SUBSCRIBER LINE IMPEDANCE MEASUREMENT DEVICE AND METHOD

[75] Inventor: Avihay Egozi, Hibat Zion, Israel

[73] Assignee: Teledata Communication Ltd., Herzlia, Israel

[21] Appl. No.: 181,214

[22] Filed: Jan. 13, 1994

[51] Int. Cl.[6] .............................. H04M 3/08; H04M 3/22; H04M 1/24
[52] U.S. Cl. .................................... 379/5; 379/6; 379/27; 379/30; 324/663
[58] Field of Search .................................. 379/5, 6, 1, 2, 379/7, 29, 30, 22, 398, 406, 410, 411, 414; 375/10; 370/13; 324/603, 607, 649, 556

[56] References Cited

U.S. PATENT DOCUMENTS

| | | | |
|---|---|---|---|
| 4,054,760 | 10/1977 | Morgen | 179/175.2 B |
| 4,307,267 | 12/1981 | Peoples | 379/30 X |
| 4,581,493 | 4/1986 | Gazzo et al. | 179/175.2 C |
| 4,620,069 | 10/1986 | Godwin et al. | 179/175.3 R |
| 4,023,098 | 5/1977 | Roth | 324/603 |
| 4,864,598 | 9/1989 | Lynch et al. | 379/6 |
| 5,025,221 | 6/1991 | Blaess | 324/603 |
| 5,166,954 | 11/1992 | Grizmala et al. | 379/6 X |

Primary Examiner—Stephen Chin
Assistant Examiner—Paul Loomis
Attorney, Agent, or Firm—Edward Langer

[57] ABSTRACT

A device and method for line impedance measurement using a multi-frequency test signal waveform in a signal injection technique featuring analysis of acquired line test response data. A multi-frequency test signal waveform is injected into the susbscriber line, to obtain by data acquisition the line response in terms of voltage measurements, which are processed via a digital filter to analyze a specific sine wave frequency. For example, if a multi-level rectangular wave signal is used as the test signal, it does not necessarily have a symmetrical waveform, and the analysis may be made at the dominant frequency derived from the rectangular wave, or other harmonics. For the frequency chosen for the analysis, it is possible to derive the line characteristics, including amplitude attenuation and phase shift, which constitute the line impedance. In the case of a multi-level rectangular wave, the amplitude is controlled between a limited number of voltage levels, and simple equipment is used to generate the rectangular wave signal, such as a relay for connection and disconnection to provide a signal with two levels. This enables generation of a signal whose frequency, e.g. duty cycle, and power capacity are continuously controllable in a simple fashion. The results of the voltage measurements representing the line response are transferred, after initial processing, to a digital filter which processes the required harmonics, and the impedance derivation is performed.

16 Claims, 3 Drawing Sheets

SUBSCRIBER LINE IMPEDANCE MEASUREMENT DEVICE AND METHOD

FIELD OF THE INVENTION

The present invention relates generally to telephone testing systems, and more particularly, to a device for measuring the subscriber line impedance and determining line status.

BACKGROUND OF THE INVENTION

Subscriber line testing is a required function of all modern telephone systems. The testing is necessary to monitor the status of the line and to detect problems requiring repair. Line impedance between the conductor pair and between each conductor and ground represents a basic parameter enabling a conclusion to be drawn about the status of the line, i.e, whether it is shorted, or whether there is leakage impedance, etc.

The prior art of line testing includes two major approaches for determining the parameters of line impedance (capacitance, inductance, resistance):
1) DC charging of the line
2) AC signal injection (or combination of these two approaches).

The first of these approaches involves charging the line for an interval, and then discharging it via a known resistance. The discharge and its characteristic curve are recorded to obtain the RC constant, from which the capacitance can be derived. The difficulty with this approach is that the line may have distributed capacitance, complicating the mathematical derivation of the true value. This is typically the problem in telephone lines.

In addition, the time required for performance of this test is lengthy, because there may be a long interval for a full line discharge. An example of this approach is given in U.S. Pat. No. 4,054,760 to Morgen, although the testing method described therein does not involve parameter derivation, but uses impedance meter deflection to indicate the status of the line.

The second approach outlined above uses AC signal injection and permits impedance derivation by measurement of two parameters: 1) Phase shift; and 2) Absolute value of impedance.

The impedance value is derived from data gathered at exact frequencies, and thus a pure sinusoid signal is required. Usually a signal generator is used to generate the sinusoidal signal. An example of this approach is given in U.S. Pat. No. 4,620,069 to Godwin et al., using sinusoidal waveform analysis.

Use of this type of signal generator has drawbacks at the time the measurement is made on communication lines, due to the variable range of the impedances, and the requirement that the generator drive the signal into the line where a low impedance may exist. In subscriber line testing, this method requires a variable frequency signal generator with high power output to force the sine wave over the length of the loop impedance. This method requires special, expensive equipment.

In U.S. Pat. No. 4,581,493 to Gazzo et al, there is disclosed a computer-control led system for accessing subscriber lines and performing various tests and reporting line conditions. The tests include measurement of line resistance and capacitance.

In U.S. Pat. No. 4,864,598 to Lynch et al, there is disclosed a loop status verification system comprising circuitry for transmitting a test signal at a sub-audible frequency over the line, and monitoring changes in the test signal, to verify line integrity. A loop current detection circuit detects the level of loop current, which is related to the loop impedance, and this information is used to generate a tone signal with a specific sub-audible frequency which is transparent to normal loop operation. The generated tone can be used to verify line integrity at a telephone central office.

As stated previously, the measurement of subscriber line impedance provides important information in determining the line status, which is the goal of all line testing methods.

Therefore, it would be desirable to provide a simple, quick, reliable and easy-to-operate device and method for subscriber line impedance testing, without using costly equipment.

SUMMARY OF THE INVENTION

Accordingly, it is a principal object of the present invention to overcome the above-mentioned disadvantages of prior art line impedance measurement techniques and provide a novel device and method for line impedance measurement using a multi-frequency test signal waveform in a signal injection technique featuring analysis of acquired line test response data.

In accordance with a preferred method of the invention, there is provided a method of measuring subscriber line loop impedance comprising the steps of:

injecting a multi-frequency voltage input signal into a subscriber line;

measuring a voltage response on the subscriber line;

filtering the voltage response at a desired frequency;

analyzing the voltage response at the desired frequency to derive the amplitude and phase shift thereof; and computing the subscriber line loop impedance from the derived amplitude and phase shift of the voltage response.

In accordance with a preferred method of the invention, a multi-frequency test signal waveform is injected into the susbscriber line. The line response is obtained by data acquisition of the response in terms of voltage measurements, which are processed via a digital filter to analyze a specific sine wave frequency. For example, if a multi-level rectangular wave signal is used as the test signal, the analysis may be made at the dominant frequency derived from the rectangular wave, or other harmonics. For the frequency chosen for the analysis, it is possible to derive the line characteristics, including amplitude attenuation and phase shift, which constitute the line impedance.

Unlike with the prior art methods, which rely on a pure sinusoidal wave for line testing, the inventive method uses a multi-frequency input signal, which does not necessarily have a symmetrical waveform. In the case of a multi-level rectangular wave, the amplitude is controlled between a limited number of voltage levels, and simple equipment is used to generate the rectangular wave signal, such as a relay for connection and disconnection to provide a signal with two levels. This enables generation of a signal whose frequency, e.g. duty cycle, and power capacity are continuously controllable in a simple fashion.

The results of the voltage measurements representing the line response are transferred, after initial processing, to a digital filter which processes the required harmonics, and from the parameters received at the filter output the impedance is derived.

The impedance derivation becomes a straightforward solution via a modeling technique of the impedance, in which the measured values at a chosen frequency are applied to an expected impedance model. For example, if a line capacitive impedance is predicted, where the capacitance is large, the filter frequency for the voltage measurements is chosen as a low value so that the capacitive impedance computation gives a non-neglected factor.

The inventive method offers the following advantages:
a) Simplicity of the signal generator (e.g. a simple relay);
b) Flexibility in choice of frequency at which measurement made (with wide range of variation);
c) Ability to drive significant power into line (the only limitation is established by the power supply); and
d) Ability to derive impedance based on a single set of voltage measurements, by observation of parameters at various harmonics via a digital filter.

Other features and advantages of the invention will become apparent from the following drawings and description.

BRIEF DESCRIPTION OF THE DRAWINGS

For a better understanding of the invention with regard to the embodiments thereof, reference is made to the accompanying drawings in which like numerals designate corresponding elements or sections throughout, and in which:

FIG. 2 is an electronic block diagram of a data acquisition system for the impedance measurement system of FIG. 1a;

DETAILED DESCRIPTION OF A PREFERRED EMBODIMENT

Figure 1A:
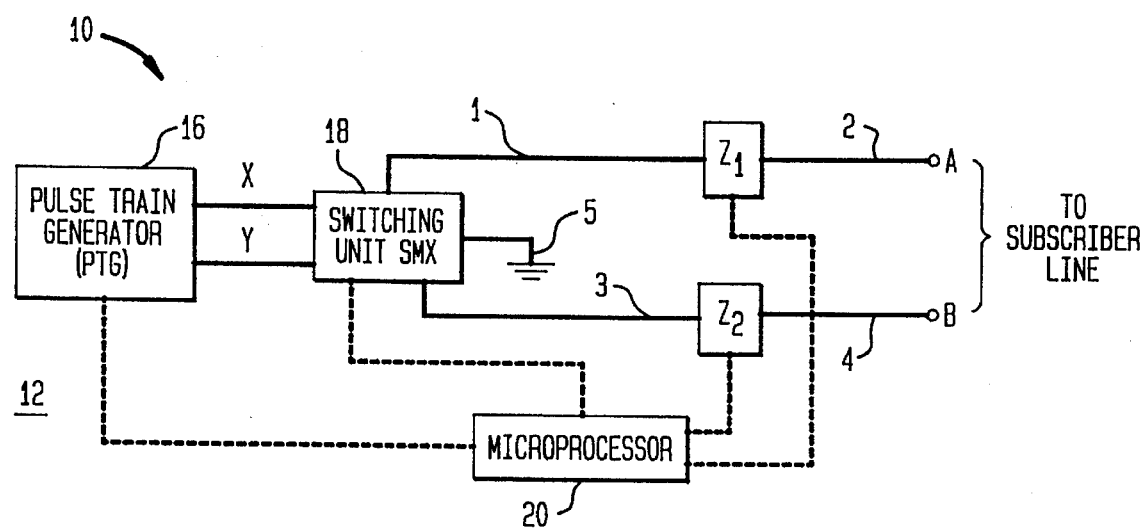
FIGS. 1a–c show, respectively, an electronic block diagram of a signal injection subsystem of a subscriber line impedance measurement system constructed and operated in accordance with the present invention, and two sample output signal voltage waveforms for injection into a subscriber line.
Figure 2:
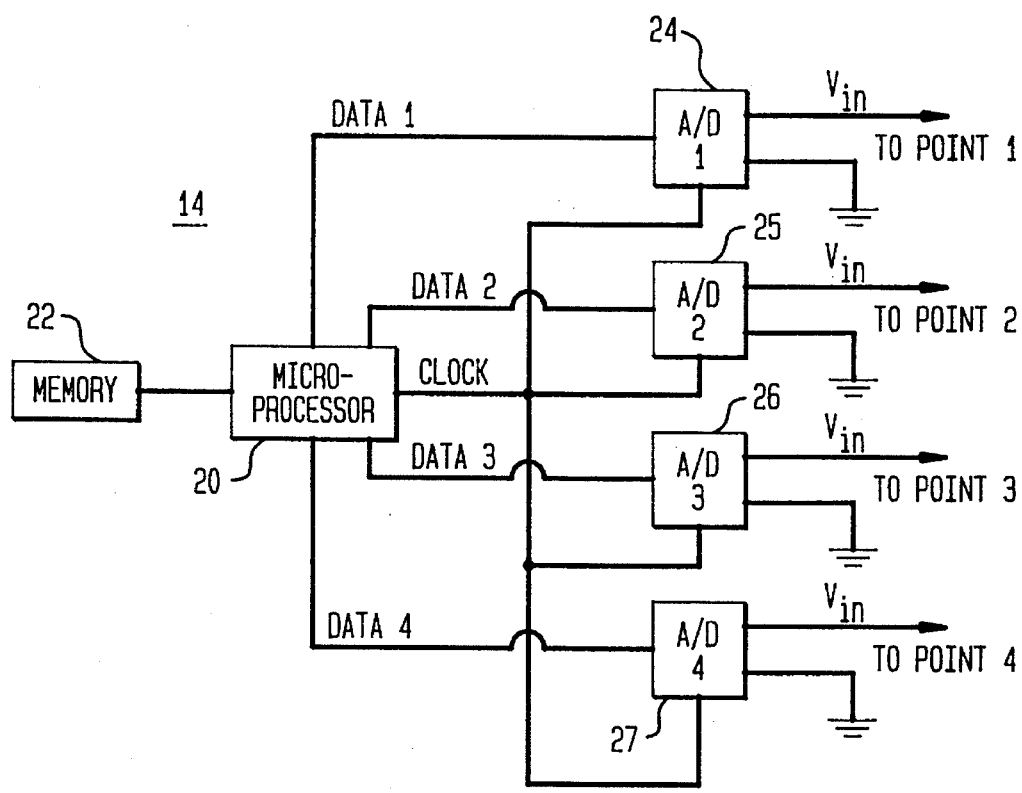

Referring now to FIGS. 1a and FIG. 2, there are shown, respectively, electronic block diagrams of a subscriber line impedance measurement system 10 constructed and operated in accordance with the principles of the present invention. System 10 comprises a signal injection subsystem 12 (FIG. 1a) and a data acquisition subsystem 14 (FIG. 2). Signal injection subsystem 12 provides a signal for injection into a telephone subscriber line, and data acquistion subsystem 14 processes the data obtained from subsystem 12 and provides a line impedance measurement. As used herein, the terms "subscriber line" refer to a pair of telephone connections, generally known as A and B, or tip and ring, etc.

Figure 1B:
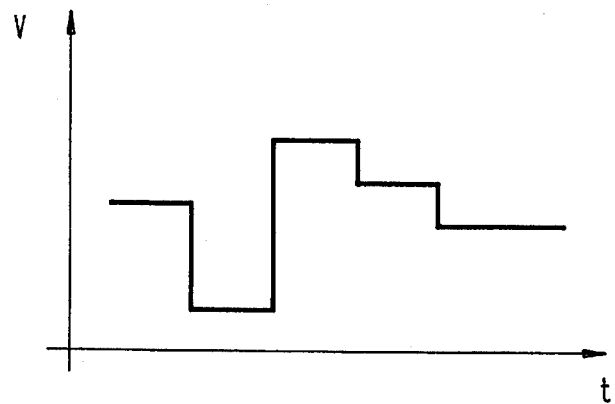
Figure 1C:
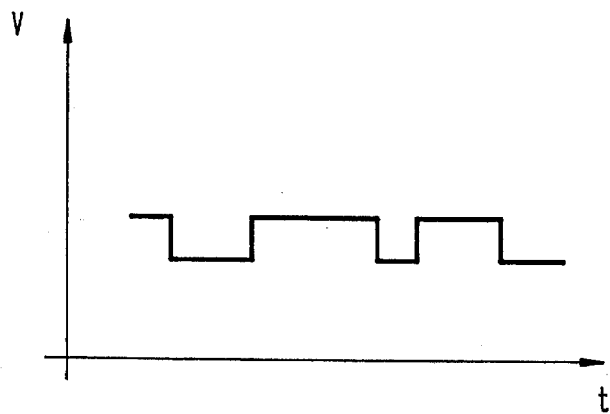

As shown in FIG. 1a, signal injection subsystem 12 comprises a multi-frequency signal generator (SG) 16, switching unit 18, and microprocessor 20, which controls the duty cycle operation of SG 16 and the operation of switching unit 18. The SG 16 can be operated to provide a multi-level rectangular or square wave output signal, such as shown in the respective voltage waveforms of FIGS. 1b–c. A telephone subscriber line pair may be connected to switching unit 18 via points A–B, via a predetermined injection impedance represented by Z1 and Z2. Microprocessor 20 also controls the value of injection impedance Z1 and Z2. The SG 16 and switching unit 18 may be provided as a combined single unit performing both functions.

A set of five connection points 1–5 are defined as voltage measurement points used in measuring the line impedance. In addition to the line impedance measurement defined as the impedance $Z_L$ between points A and B, it may also be desirable to measure the leakage impedance between point A and ground (point 5) or between point B and ground. Switching unit 18 controls the signal injection path which must be chosen for making these different measurements.

Switching unit 18 allows for the choice of the SG 16 output (X and Y) connections for providing the signal generator output to two of the three points shown, either 1, 3 or 5. For example, when performing a test between points A and B, switching unit 18 connects X to point 1 and Y to point 3. The injection is performed via predetermined injection impedance Z1 or Z2, each being connected to a respective one of lines A or B, and the injection to the ground (at point 5) is always done via a zero impedance, or short circuit. The injection impedances may have any value, including a pure ohmic resistance, and it is possible to choose a value of zero impedance, by provision of appropriate control signals from microprocessor 20.

In use, the data acquisition subsystem 14 measures the voltage at four points 1–4, and the voltage at these points V1–V4 is measured several times. The number of times the measurement is made is a variable and is based on the frequency which is desired, based also on the expected line impedance model in order to obtain a desired accuracy, as described further herein.

Referring now to FIG. 2, measurements are performed simultaneously at each of the four points 1–4, and the values obtained are converted by each of respective A/D converters 24–27, to digital values which are stored in the memory 22 of microprocessor 20. In this embodiment, the measurement points on the subscriber line are each connected individually to an A/D converter. Alternatively, a multiplexing system can be used to accept the measurements from each of the points via a single A/D converter which rapidly scans all the measurement points for data acquisition.

Using these measurements, it is possible to compute the instantaneous voltage drop on each of the impedances. For example, the voltage drop on impedance Z1 is the simple subtraction of $V_2-V_1$, and the voltage drop across the line is the difference between $V_4$ and $V_2$, etc.

Figure 3:
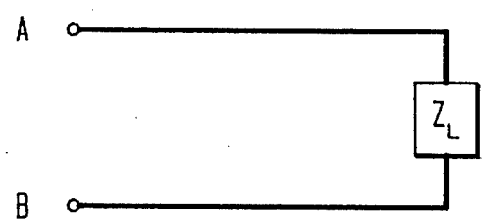
FIG. 3 is an equivalent circuit for a line impedance.

With the voltage drop measurements, it is possible to compute the line impedance. In order to demonstrate the method of performing the computation, a line impedance model is assumed having an impedance $Z_L$, which includes a resistance and capacitance in series connection such as in FIG. 3. Thus, the impedance will have the form:

$$Z_L = R_L + 1/jWC \quad \text{(Eq. 1)}$$

In the case of a more complicated impedance, the computation described herein will be carried out in a similar fashion.

Figure 4:
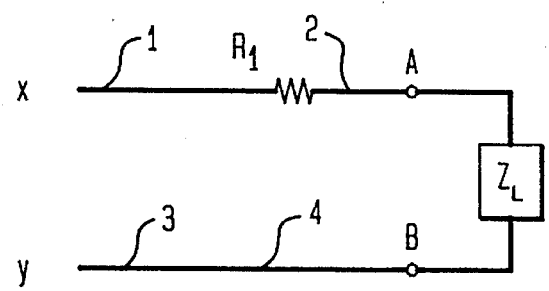
FIG. 4 is a system configuration for measurement of the line impedance shown in the model of FIG. 3.

In the example shown in FIG. 4, for simplicity, serial injection impedance Z1 is chosen as the value R1, and the ohmic value of Z2 is chosen as zero which is a short circuit. The serial injection impedance is chosen to achieve impedance matching in a voltage divider arrangement, so that the portion of the voltage drop across the injection resistance is roughly equal to the voltage drop expected across the subscriber line. This involves a tradeoff in the choice of injection resistance, beginning with higher resistance to protect the test equipment in case of the presence of voltage on the subscriber line.

Several techniques, such as application of a Fourier transform, can be used to transform the measured voltage functions as a function of time between the points to which the voltage is applied, from the time domain to the frequency domain.

As an example of such a transformation, it is possible to use a mathematical filter in which the measured voltages as a function of time are transformed using the digital mathematical filter, which selects the desired frequency. For example, for the voltage drops between measurement points 2-1 and 4-2, respectively, the voltage may be indicated by $V_{21}(t)$ and $V_{42}(t)$.

Then two functions are derived by the filter, each being the voltage as a function of time for the given frequency chosen by the filter, and this can be expressed as the voltage at a given frequency (such as $w_0$) by the notation $V_{21}(t, w_0)$ or $V_{42}(t, w_0)$. From those functions, the following equations are applied, to obtain the of capacitance and resistance values $$|Z_L| = \frac{|V_{42}(t, w_0)|}{|V_{21}(t, w_0)|} \times R1 \qquad \text{(Eq. 2)}$$

$$\phi = \text{delta } \theta \qquad \text{(Eq. 3)}$$

$$Z_L = |Z_L| e^{i\phi} \qquad \text{(Eq. 4)}$$

$$C_L = |Z_L| \sin \phi \qquad \text{(Eq. 5)}$$

$$R_L = |Z_L| \cos \phi \qquad \text{(Eq. 6)}$$

where $Z_L$=line impedance;

$V_{ab}(t, w_0)$=voltage drop between points a–b at frequency $w_0$ $\psi$=phase difference;

$C_L$=line capacitance;

$R_L$=line resistance.

The phase difference (delta $\theta$) can be measured, for example, by measuring the time differential at the zero crossing point for each of the two voltage functions obtained at the desired filtered frequency. After using the transform or the mathematical filter as applied to the first frequency chosen, the process can be repeated at a different frequency, e.g. $w_1$, without requiring additional voltage measurements.

In this way, the accuracy of the measurements can be determined a shorter time to observe whether the values are in conformity. If not, the measurements may be considered invalid. The ability to quickly and easily change the measurement frequency greatly simplifies the procedure when the circuit has combined capacitance and inductance, and measurement at one frequency does not allow derivation of each value, only their sum.

For the case of a combined impedance, in order to derive the component impedance values, extreme values for the chosen frequencies are inserted in the equation (such as Eq. 1) to eliminate the other factor from the sum.

As part of the data analysis once the voltage measurements have been made, the model for representing the impedance is generally chosen either as capacitive impedance dominant, or resistive impedance dominant, or inductance impedance dominant. With this model, the values of the voltage measurements can be applied to attempt to determine the individual values of the line impedance.

For example, if a line capacitive impedance is predicted, where the capacitance is quite large, the filter frequency of measurement can be chosen as a low value to compensate for this, so as to keep the value of the denominator in the impedance factor at a low value resulting in a non-neglected term in the sum (Eq. 1). One of the advantages in this procedure is that the model proposed for the line impedance does not have to be any particular model at all, but for whatever model is chosen, the existing data from the voltage measurements can be applied to it by choosing the right filtering frequency and the equations which are used to represent the line impedance model.

Figure 5:
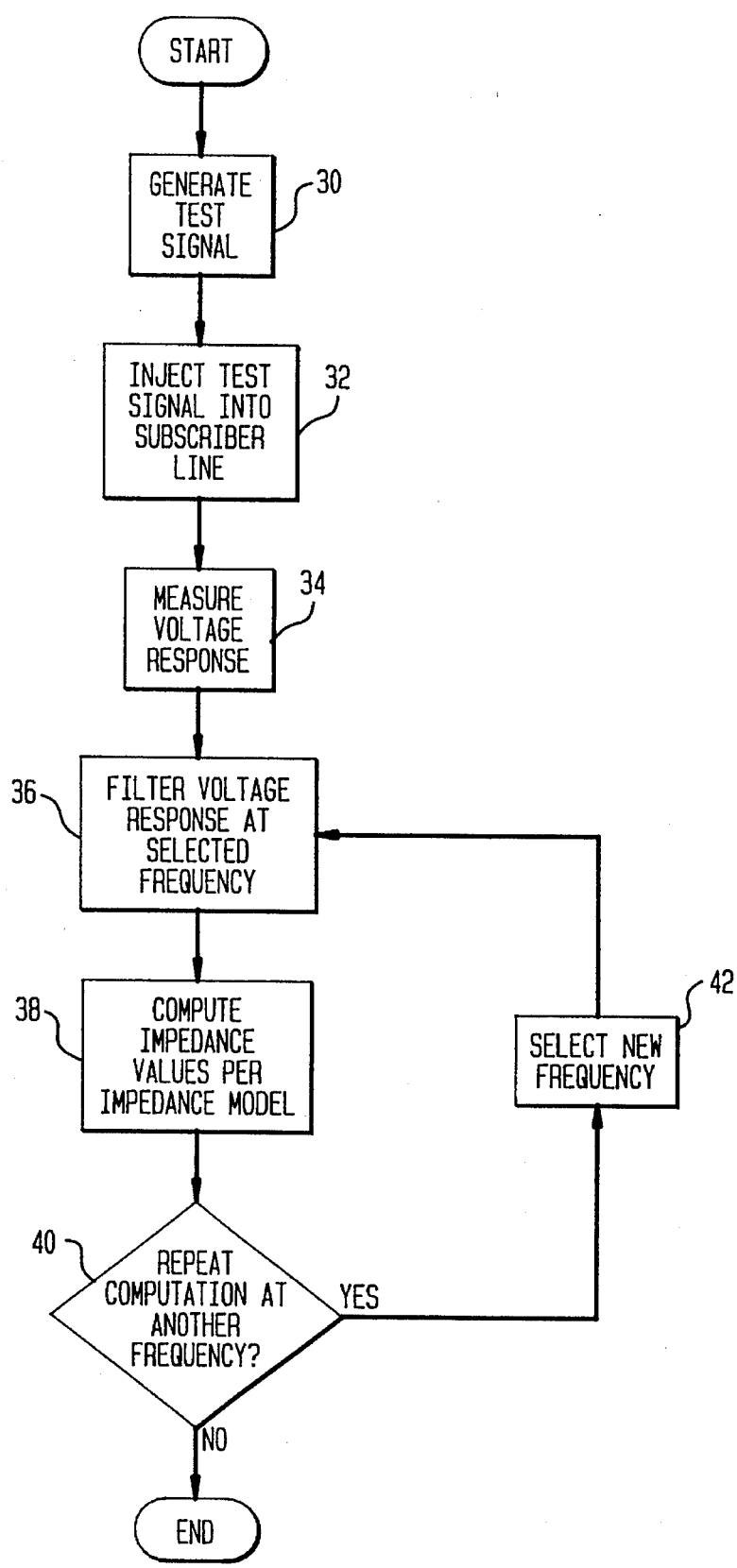
FIG. 5 is a flowchart showing a method of performing a subscriber line impedance measurement using the system of FIG. 1.

In FIG. 5, a flowchart is shown outlining the steps in performance of the inventive method, and this may be used to develop a control program for implementation in microprocessor 20. The procedure for line impedance measurement begins in block 30 with generation of a test signal waveform by PTG 16, as either a multi-level rectangular or square wave type pulse. In block 32, the pulse train is injected into the subscriber line via the injection impedance. Voltage measurements are then recorded at various points on the line in block 34.

Once the voltage measurements have been made, a filtering technique is applied in block 36 to obtain the measured voltage as a function of time at a given frequency. For that given frequency, knowing the voltage as a function of time, a computation is carried out in block 38, based on the modeling technique described previously to predict what the line impedance may be like. The data from the voltage measurements is then applied in simple equations representing the model, and the impedance of the line can be immediately derived from the relationship of the measured voltages to the input voltage which provides the amplitude attenuation and phase shift.

In decision block 40, if an additional computation is required at a different frequency, control is transferred to block 42, for selection of a new frequency, and the filtering and computation steps are repeated, respectively, in blocks 36–38.

Once it has been determined that sufficient computations have been carried out for a given test signal, block 40 ends the procedure. The method may be repeated with a new test signal by re-initiating the procedure in block 30.

In summary, the inventive method offers the advantages of using a simple signal generator (e.g. a simple relay), flexibility in the frequency selected for analysis of the response, the ability to drive significant power into the line, and the ability to derive impedance based on a single set of voltage measurements, by observation of parameters at various harmonics via a digital filter.

Having described the invention with regard to certain specific embodiments thereof, it is to be understood that the description is not meant as a limitation since further modifications may now suggest themselves to those skilled in the art and it is intended to cover such modifications as fall within the scope of the appended claims.

I claim:

1. In a telephone system, a subscriber line loop impedance measurement device comprising:

means for injecting a multi-frequency input signal into a subscriber line;

means for measuring a voltage response on said subscriber line;

means for filtering said voltage response to obtain its value at a desired frequency;

means for analyzing said voltage response value at said desired frequency to derive the amplitude and phase shift thereof; and means for computing the subscriber line loop impedance from said derived amplitude and phase shift of said voltage response value.

2. The device of claim 1 wherein said means for injecting comprises a pulse train generator which provides a multi-level rectangular voltage input signal through a known impedance to said subscriber line.

3. The device of claim 1 wherein said means for injecting comprises a switching unit for applying said multi-frequency input signal to preselected points on said subscriber line.

4. The device of claim 3 wherein said preselected points comprise a pair of line connections of said subscriber line.

5. The device of claim 3 wherein said preselected points comprise a line connection of said subscriber line and a ground connection.

6. The device of claim 1 wherein said measuring means comprises an A/D converter.

7. The device of claim 1 wherein said filtering means comprises a digital mathematical filter programmed with said desired frequency for obtaining said voltage response value.

8. The device of claim 1 wherein said analyzing and computing means comprise a microprocessor.

9. In a telephone system, a method of measuring subscriber line loop impedance comprising the steps of:

injecting a multi-frequency input signal into subscriber line;

measuring voltage response on said subscriber line;

filtering said voltage response to obtain its value at a desired frequency;

analyzing said voltage response value at said desired frequency to derive the amplitude and phase shift thereof; and computing the subscriber line loop impedance from said derived amplitude and phase shift of said voltage response value.

10. The method of claim 9 wherein said injecting step comprises generating a pulse train defining a multi-level rectangular voltage input signal and applying said pulse train through a known impedance to said subscriber line.

11. The method of claim 9 wherein said injecting step is performed by a switching unit for applying said multi-frequency input signal to preselected points on said subscriber line.

12. The method of claim 11 wherein said preselected points comprise pair of line connections of said subscriber line.

13. The method of claim 9 wherein said preselected points comprise a line connection of said subscriber line and a ground connection.

14. The method of claim 9 wherein said measuring step is performed by an A/D converter.

15. The method of claim 9 wherein said filtering step is performed by a digital mathematical filter programmed with said desired frequency for obtaining said voltage response value.

16. The method of claim 9 wherein said analyzing and computing step are performed in a microprocessor.

* * * * *